(12) United States Patent
Ramaraju (10) Patent No.: US 8,339,838 B2
(45) Date of Patent: Dec. 25, 2012

(54) IN-LINE REGISTER FILE BITCELL

(75) Inventor: Ravindraraj Ramaraju, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 20 days.

(21) Appl. No.: 13/017,595

(22) Filed: Jan. 31, 2011

(65) Prior Publication Data

US 2012/0195111 A1    Aug. 2, 2012

(51) Int. Cl.
    *G11C 11/00*     (2006.01)
(52) U.S. Cl. ...................................... 365/154
(58) Field of Classification Search ............ 365/154
See application file for complete search history.

(56) References Cited

U.S. PATENT DOCUMENTS

| | | | |
|---|---|---|---|
| 5,003,509 A | 3/1991 | Bosnyak | |
| 6,091,626 A | 7/2000 | Madan | |
| 6,173,379 B1 * | 1/2001 | Poplingher et al. | 711/165 |
| 6,262,932 B1 | 7/2001 | Nguyen | |
| 6,510,076 B1 | 1/2003 | Lapadat et al. | |
| 7,164,596 B1 | 1/2007 | Deng et al. | |
| 7,193,924 B2 | 3/2007 | Ramaraju et al. | |
| 7,355,906 B2 | 4/2008 | Joshi et al. | |
| 7,400,523 B2 | 7/2008 | Houston | |
| 7,471,546 B2 | 12/2008 | Matick et al. | |
| 7,499,312 B2 | 3/2009 | Matick et al. | |
| 7,826,282 B2 * | 11/2010 | Schmitt | 365/189.17 |
| 7,983,071 B2 * | 7/2011 | Houston | 365/154 |
| 8,111,543 B2 * | 2/2012 | Niki et al. | 365/154 |
| 2007/0242513 A1 | 10/2007 | Chang et al. | |
| 2009/0175069 A1 | 7/2009 | Houston | |
| 2009/0303775 A1 | 12/2009 | Kulkarni et al. | |
| 2010/0142258 A1 | 6/2010 | Tsai et al. | |

OTHER PUBLICATIONS

I.J. Chang et al., A 32kb 10T Subthreshold SRAM Array with Bit-Interleaving and Differential Read Scheme in 90nm CMOS, IEEE International Solid-State Circuits Conference, 2008.
EP Application No. EP12151635, Partial European Search Report, dated Apr. 25, 2012.

* cited by examiner

*Primary Examiner* — VanThu Nguyen
(74) *Attorney, Agent, or Firm* — Hamilton & Terrile, LLP; Michael Rocco Cannatti (57) ABSTRACT

An SRAM bitcell architecture is described having a dedicated read port (N0/N1/N6, N3/N4/N7) with pull up transistors (N6, N7) that shares at least a first bit line pair (23, 24) and word line signal (25), thereby providing separate data access read paths to a 6T SRAM architecture such that the read port is connected to drive the cell read node without exposing the memory cell during read operations and to act as a write port during write operations.

19 Claims, 4 Drawing Sheets

IN-LINE REGISTER FILE BITCELL

BACKGROUND OF THE INVENTION

1. Field of the Invention

The present invention is directed in general to integrated circuit memories. In one aspect, the present invention relates to a static random access memory.

2. Description of the Related Art

Static random access memories (SRAMs) are generally used in applications requiring high speed, such as microprocessors and other data processing systems which use register files and memories for high speed computing. Each SRAM cell stores one bit of data and is implemented as a pair of cross-coupled inverters which are stable in one of two possible voltage levels, and the logic state of the cell is determined with a pair of access transistors, thereby creating the basic six-transistor (6T) SRAM architecture. The read stability and writability of SRAM cells have been improved by adding additional transistors to the basic 6T architecture. For example, 8T and 10T subthreshold SRAMs have been proposed which provide single-ended read sensing, but such single-ended read sensing methods still suffer from bitline noise resulting from transients, process variations, soft error, and power supply fluctuations which may cause the cell to inadvertently change logic states. To achieve a larger static noise margin (SNM), the dimensions of the memory cell should be enlarged, but this results in reduced output speed. Accordingly, a need exists for improved SRAM cell design to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

An SRAM bitcell architecture is described having a dedicated read port that shares at least a first bit line pair and word line signal by providing separate data access read paths to a 6T SRAM architecture. Each data access path includes one or more read port transistors which are connected to drive the cell read node without exposing the storage node of the memory cell during read operations and to act as a write port during write operations. By providing a dedicated read port design which isolates the memory cell storage node during read operations and prevents the memory cell from driving the bit lines, the dimensions of the transistors in the SRAM cell are not limited by the required driving capability, meaning that the SRAM architecture can use the minimum-size transistors in the memory cell to achieve a higher operation speed and meet the requirement of the high-speed digital circuit. In addition, by disclosing a single port bitcell with dedicated read port that shares a common bit line pair and word line, the bitcell can be interleaved with a 6T bitcell array to support a variety of applications, such as multi-bit upset soft error rate (SER) event detection.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected embodiments of the present invention are implemented, for the most part, with electronic components and circuits known to those skilled in the art, and as a result, circuit details have not been explained in any greater extent since such details are well known and not considered necessary to teach one skilled in the art of how to make or use the present invention. In addition, selected aspects are depicted with reference to simplified circuit schematic diagrams and block diagram drawings without including every circuit detail or feature in order to avoid limiting or obscuring the present invention. Such descriptions and representations are used by those skilled in the art to describe and convey the substance of their work to others skilled in the art.

Figure 1:
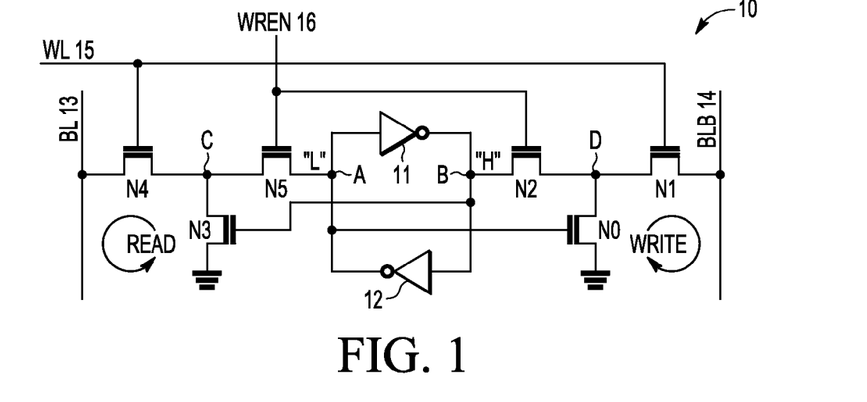
FIG. 1 is a simplified schematic diagram of a 10T SRAM cell with a dedicated read port to single bit line pair.

Referring now to FIG. 1, there is shown a simplified schematic diagram of a 10T SRAM cell 10 with dedicated read ports to a single pair of bit lines. The depicted SRAM cell 10 includes a memory unit of two cross-coupled inverters 11-12 and two data access paths to a shared bit line pair 13-14. The memory unit includes two inverters 11, 12, where each inverter is formed from an NMOS and PMOS transistor pair (not shown) connected in series and cross coupled to the other inverter to enable the memory unit to store data at internal nodes A, B. Each data access path includes an access transistor N2, N5 for controlling write access to the memory unit nodes A, B via the write enable line (WREN) 16. In addition, the data access paths also include read ports which are symmetrically connected between the memory unit 11, 12 and the bit line pair 13, 14, where each read port provides isolated read access to the memory unit nodes A, B via the word line (WL) 15 so that the memory unit has improved noise immunity. In FIG. 1, the first read port N0, N1 is connected between the memory unit 11, 12 and the bit line BLB 14 so that the memory unit (internal node A) gates a first read port transistor N0 which is connected between ground and read node D which in turn is connected via second read port transistor N1 to bit line BLB 14 under control of the word line signal 15. Similarly, the second read port N3, N4 is connected between the memory unit 11, 12 and the bit line BL 13 so that the memory unit (internal node B) gates a first read port transistor N3 which is connected between ground and read node C which in turn is connected via second read port transistor N4 to bit line BL 13 under control of the word line signal 15. The improved immunity results from the fact that, during read operations when WL=1 and WREN=0, each read port (e.g., N0-N1) connects its corresponding bit line (e.g., 14) to the internal memory unit node (e.g., A) while the access transistor (e.g., N2) isolates the memory unit 11-12 from the bit lines so that the read signals of the bit line 14 are not driven by the memory unit.

During read operations, the access transistors N2, N5 are turned OFF (WREN=0) and the access path transistors N1, N4 are turned ON (WL=1). As a result, a first read port is formed by transistors N0, N1 which effectively connect the bit line BLB 14 to the internal node B, and a second read port is formed by transistors N3, N4 which effectively connect the bit line BL 13 to the internal node A. For example, if the internal nodes A, B store low voltage value (e.g., "L") and a high voltage value (e.g., "H"), respectively, to represent a first memory value, then the first read port N0, N1 effectively conveys the stored "H" value from internal node B to the bit line BLB 14, while the second read port N3, N4 effectively conveys the stored "L" value from internal node A to the bit line BL 13. During a write operation when a "H" value is present on the bit line BL 13 and a "L" value is present on the bit line BLB 14, transistors N1 and N2 pass the "L" from the BLB 14 to flip the "H" value at internal node B to a "L" value, and transistors N4 and N5 pass the "H" from the BL 13 to flip the "L" value at internal node A to a "H" value.

By providing read ports in the access paths, isolated read access paths are provided which do not expose the memory unit during read operations, thereby improving the stability and persistence for the bit line pair 13, 14 (BL and BLB). In addition, the static noise margin (SNM) for the SRAM cell 10 is reduced as compared to conventional 6T SRAM designs in which the memory cell transistors must be larger than the access transistors in order to maintain the stability and function of data in the 6T SRAM. In contrast, the memory unit transistors in the 10T SRAM cell 10 do not drive the read signals of the bit lines 13-14 during read operations, and therefore can the minimum-size transistors to achieve a higher operation speed and meet the requirement of the high-speed digital circuit. The isolate read ports also promote memory cell efficiency by enabling reading and writing activities of the same memory unit to be completed in the same cycle.

As seen in FIG. 1, read access to the 10T SRAM cell 10 is controlled via WL (Read Word Line) which connects the bit line pair 13, 14 to the read ports N0-N1/N4-N5 to maintain the desired static noise margin without interfering with the reading activities. During writing operations, the write enable (WREN) line 16 and word line 15 will turn on to provide a writing path from the bit line pair 13, 14 to the memory unit 11, 12. In selected embodiments, the read port transistors N0/N1, N3/N4 may be implemented with sub-threshold voltage (Vsub-th) NMOS (N-channel Metal Oxide Semiconductor) transistors to decrease the NMOS threshold voltage to the lowest possible CMOS threshold voltage, preferably by providing a width ratio preference for writing when the read port transistor (e.g., N3) is ON so that the read port transistors (e.g., N3 and N4) provide resistive dividing to minimize short circuit current. Thus, N3 is ON until value "L" is written into node B, while value "H" is on BL 13, N4 and N3 are ON (forming resistor divider), and N5 and the NMOS device of inverter 12 are also ON. With the arrangement, the short circuit current is minimized until N3 and the NMOS device of inverter 12 are turned ON. Even so, there remain design challenges with reading "H" values from the 10T SRAM cell 10 since, even though the read port transistor (e.g., N0) is OFF, the access transistor (e.g., N2) connected to the "H" node (e.g., B) prevents the memory unit 11, 12 from driving the read node (e.g., D) high, meaning that the read node in this may float.

Figure 2:
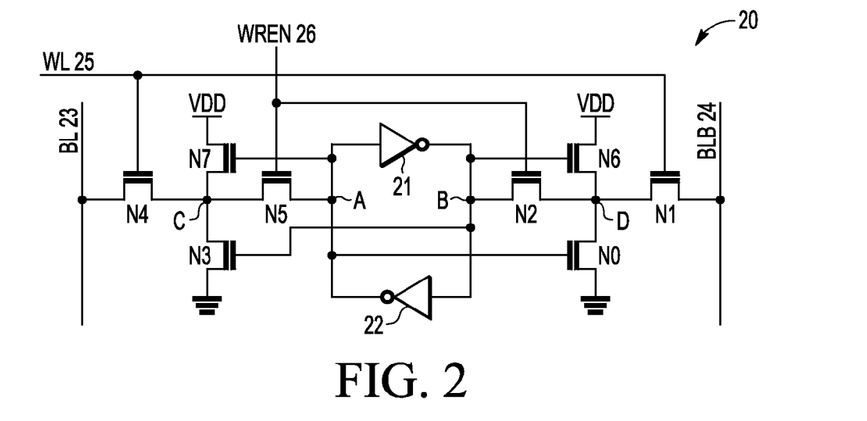
FIG. 2 is a simplified schematic diagram of a 12T SRAM cell with a pair of read node driver transistors for dedicated read ports to single pair of bit lines.

One way to improve the read performance is illustrated with reference to FIG. 2 which shows a simplified schematic diagram of a 12T SRAM cell 20 with a pair of NMOS read node driver transistors N6, N7 for dedicated read ports to a single pair of bit lines 23, 24. The depicted SRAM cell 20 includes a memory unit of two cross-coupled inverters 21, 22 with symmetric data access paths to a bit line pair 23-24 that is shared between the write port and read port. Each data access path includes access transistors N2, N5 under control of WREN line 26 to write to internal nodes A, B. In addition, each data access path includes read ports symmetrically connected between the memory unit 21, 22 and the bit line pair 23, 24, where each read port is controlled by WL 25 and WREN 26 to provide isolated read access to the memory unit nodes A, B so that the memory unit has improved noise immunity. In FIG. 2, the first read port N0, N1, N6 is connected between the memory unit 21, 22 and the bit line BLB 24 so that the memory unit (internal node A) gates a first read port transistor N0 which is connected between ground and read node D which in turn is connected via second read port transistor N1 to bit line BLB 24 under control of the word line signal 25. The read node D in the first read port is also connected via third read port transistor N6 to a supply voltage (e.g., Vdd) under control of the other internal node (e.g., B) in the memory unit 21, 22, thereby pulling the read node D up when the other internal node is high. Similarly, the second read port N3, N4, N7 is connected between the memory unit 21, 22 and the bit line BL 23 so that the memory unit (internal node B) gates a first read port transistor N3 which is connected between ground and read node C which in turn is connected via second read port transistor N4 to bit line BL 23 under control of the word line signal 25. The read node C in the second read port is also connected via third read port transistor N7 to a supply voltage under control of the other internal node (e.g., A) in the memory unit 21, 22 to pull the read node D up when the other internal node is high. As seen from the foregoing, the presence of the read node driver transistors N6, N7 improves the read performance of the SRAM cell 20 by actively driving the read nodes C, D so that there is no floating of the read nodes.

Figure 3:
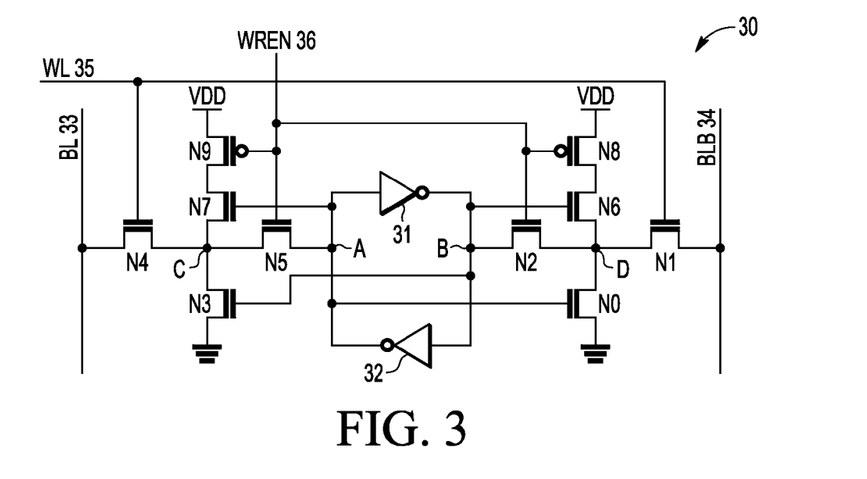
FIG. 3 is a simplified schematic diagram of a 14T SRAM cell with high side read node driver transistors for dedicated read ports to single pair of bit lines.

Another way to improve the read performance is illustrated with reference to FIG. 3 which shows a simplified schematic diagram of a 14T SRAM cell 30 which adds a pair of PMOS high side read node driver transistors N8, N9 to the NMOS read node driver transistors N6, N7 in the dedicated read ports to the single pair of bit lines 33, 34. The depicted SRAM cell 30 includes a memory unit 31, 32 with symmetric data access paths to a shared bit line pair 33-34. Each data access path includes access transistors N2, N5 under control of WREN 36 to write to internal nodes A, B. In addition, each data access path includes read ports symmetrically connected between the memory unit 31, 32 and the bit line pair 33, 34, where each read port is controlled by the WL 35 and WREN 36 to provide isolated read access to the memory unit nodes A, B so that the memory unit has improved noise immunity. In FIG. 3, the first read port N0, N1, N6, N8 is connected between the memory unit 31, 32 and the bit line BLB 34 so that the memory unit (internal node A) gates a first NMOS read port transistor N0 which is connected between ground and read node D which in turn is connected via second NMOS read port transistor N1 to bit line BLB 34 under control of the word line signal 35. The read node D in the first read port is also connected via series connected third NMOS read port transistor N6 and fourth PMOS read port transistor N8 to a supply voltage under control of the other internal node (e.g., B) and the WREN line 36, respectively, thereby pulling the read node D up when the other internal node is high. Similarly, the second read port N3, N4, N7, N9 is connected between the memory unit 31, 32 and the bit line BL 33 so that the memory unit (internal node B) gates a first NMOS read port transistor N3 which is connected between ground and read node C which in turn is connected via second NMOS read port transistor N4 to bit line BL 33 under control of the word line signal 35. The read node C in the second read port is also connected via third NMOS read port transistor N7 and fourth PMOS read port transistor N9 to a supply voltage under control of the other internal node (e.g., A) and the WREN line 36, respectively, to pull the read node D up when the other internal node is high. As seen from the foregoing, the presence of the high side read node driver transistors N6/N8, N7/N9 improves the read performance of the SRAM cell 30 by acting as a hold or keeper latch to pull up the high data at read nodes C, D so that there is no floating of the read nodes. In addition, the high side read node driver transistors N6/N8, N7/N9 are effectively disabled during write operations (when WL and WREN are HIGH) by turning OFF the fourth PMOS read port transistors N8, N9 to prevent fighting the lowside and make writing easier.

Figure 4:
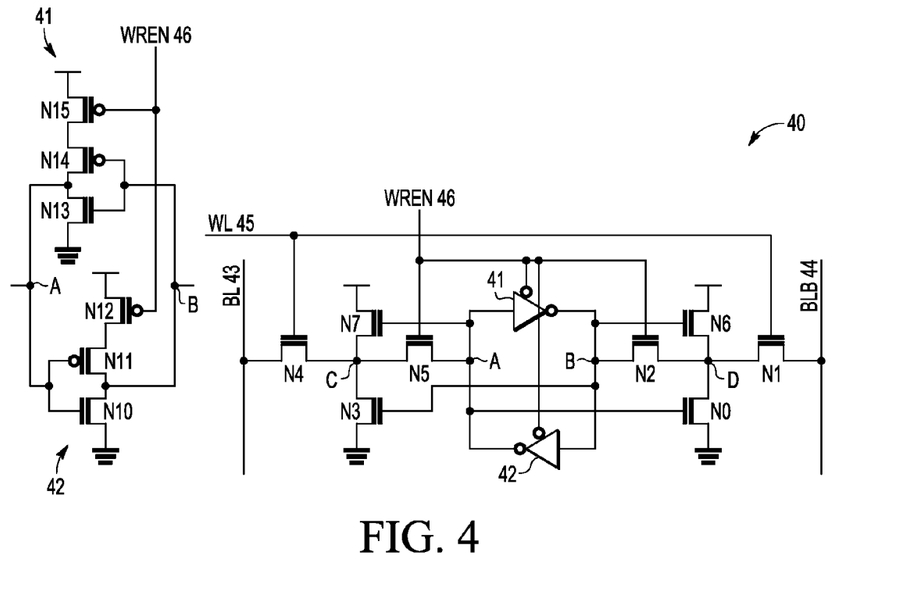
FIG. 4 is a simplified schematic diagram of a 14T SRAM cell with inverter cutoff transistors for dedicated read ports to single pair of bit lines.

In addition or in the alternative, another way to improve the read performance is illustrated with reference to FIG. 4 which shows a simplified schematic diagram of a 14T SRAM cell 40 which adds inverter cutoff transistors to the NMOS read node driver transistors N6, N7 in the dedicated read ports to the single pair of bit lines 43, 44. The depicted SRAM cell 40 includes a memory unit 41, 42 with symmetric data access paths to the shared bit line pair 43-44 which include access transistors N2, N5 and symmetric read ports N0/N2/N6, N3/N4/N7 for connecting the memory unit 41, 42 and the bit line pair 43, 44 under control of the WL 45 and WREN 46 signals, substantially as described above with reference to FIG. 2 to provide improved noise immunity. However, the WREN 46 signal is also applied to deactivate the inverters 41, 42 used to form the memory unit. While the inverters 41, 42 may be disabled using any desired approach, an example approach shown in FIG. 4 adds an extra PMOS transistor which is gated by the WREN 46 signal to kill each of inverters 41, 42. For example, the memory unit 41, 42 may be implemented with a cross-coupled pair of inverters, each of which is connected to a first power supply voltage (e.g., Vdd) by an inverter cutoff transistor. As shown to the left of FIG. 4, one inverter 42 of the cross-coupled pair of inverters includes a series-coupled NMOS transistor N10 and PMOS transistor N11 which are connected to the power supply voltage by the PMOS cutoff transistor N12 which is gated by the WREN 46 signal. The other inverter 41 of the cross-coupled pair of inverters includes a series-coupled NMOS transistor N13 and PMOS transistor N14 which are connected to the power supply voltage by the PMOS cutoff transistor N15 which is gated by the WREN 46 signal. The storage node A at the output of inverter 42 is coupled to the input of the inverter 41, while storage node B at the output of inverter 41 is coupled to the input of the inverter 42. As seen from the foregoing, the presence of the read node driver transistors N6, N7 improves the read performance of the SRAM cell 40 by actively driving the read nodes C, D so that there is no floating of the read nodes. In addition, the inverter cutoff transistors N12, N15 effectively kills the inverters 41, 42 during write operations (when WL and WREN are HIGH), though the WREN signal 46 may also be applied to turn OFF additional PMOS read port transistors (not shown) connected between NMOS read node driver transistors N6, N7 and the reference voltage (similar to transistors N8 and N9 in FIG. 3) to prevent fighting the lowside and make writing easier.

In the illustrative embodiments described thus far, the SRAM cell is provided with a dedicated read port which connects each memory unit to a single pair of bit lines without disturbing the storage nodes A, B of the memory cell during read operations, and which also acts as a write port during write operations, all under control of single word line WL signal. Because the disclosed read port structure effectively isolates the read nodes C, D from the internal storage nodes A, B, it is possible to extend the SRAM cell design to provide multiple read ports for each SRAM cell by using the WL signal to gate an additional read port transistor that is connected between the read node and the additional bit line.

Figure 5:
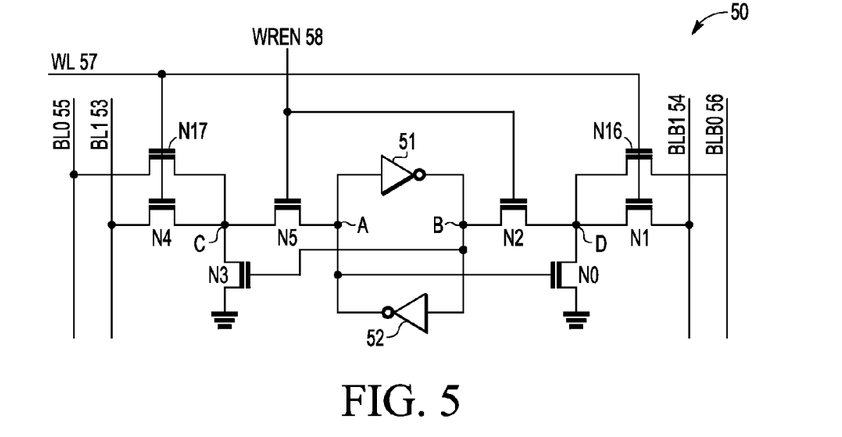
FIG. 5 is a simplified schematic diagram of a 12T SRAM cell with dedicated read ports coupled to a plurality of bit line pairs.

To illustrate a multi-bit line pair embodiment, reference is now made to FIG. 5 which shows a simplified schematic diagram of a 12T SRAM cell 50 with a dedicated read port coupled to a plurality of bit line pairs. The depicted SRAM cell 50 includes a memory unit 51, 52 with symmetric data access paths to a first pair of shared bit lines BL0, BLB0 53-54 which include access transistors N2, N5 and symmetric read ports N0/N2, N3/N4 for connecting the memory unit 51, 52 and the first pair of shared bit lines 53-54 under control of the WL 57 and WREN 58 signals, substantially as described above with reference to FIG. 1. However, the SRAM cell 50 also includes one or more additional pairs of read port transistors N16, N17 for connecting the read nodes D, C to a second pair of shared bit lines BL1, BLB1 55, 56 under control of the shared WL 57 signal.

Figure 6:
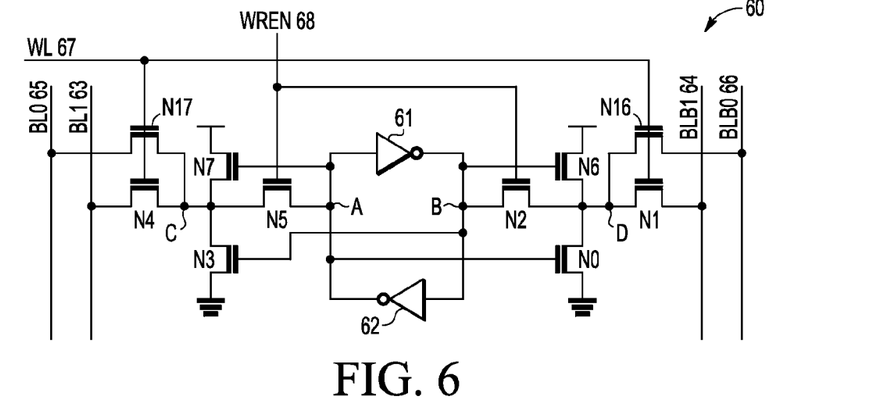
FIG. 6 is a simplified schematic diagram of a 14T SRAM cell with a pair of read node driver transistors for dedicated read ports coupled to a plurality of bit line pairs.

Another multi-bit line pair embodiment is illustrated with reference to FIG. 6 which shows a simplified schematic diagram of a 14T SRAM cell 60 with a pair of read node driver transistors N6, N7 for a dedicated read port coupled to a plurality of bit line pairs. The depicted SRAM cell 60 includes a memory unit 61, 62 with symmetric data access paths to a first pair of shared bit lines BL0, BLB0 63-64 which include access transistors N2, N5 and symmetric read ports N0/N2/N6, N3/N4/N7 for connecting the memory unit 61, 62 and the first pair of shared bit lines 63-64 under control of the WL 67 and WREN 68 signals, substantially as described above with reference to FIG. 2. However, the SRAM cell 60 also includes one or more additional pairs of read port transistors N16, N17 for connecting the read nodes D, C to a second pair of shared bit lines BL1, BLB1 65, 66 under control of the shared WL 67 signal.

Figure 7:
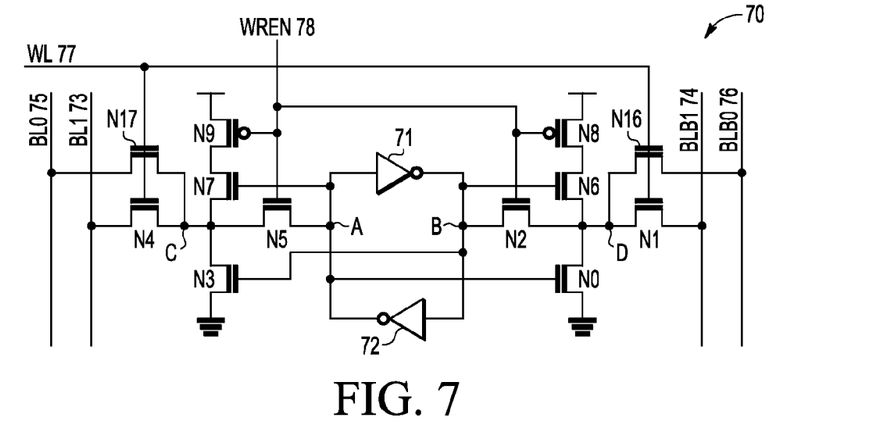
FIG. 7 is a simplified schematic diagram of a 16T SRAM cell with high side read node driver transistors for dedicated read ports coupled to a plurality of bit line pairs.

Yet another multi-bit line pair embodiment is illustrated with reference to FIG. 7 which shows a simplified schematic diagram of a 16T SRAM cell 70 with high side read node driver transistors N8, N9 for a dedicated read port coupled to a plurality of bit line pairs. The depicted SRAM cell 70 includes a memory unit 71, 72 with symmetric data access paths to a first pair of shared bit lines BL0, BLB0 73-74 which include access transistors N2, N5 and symmetric read ports N0/N2/N6/N8, N3/N4/N7/N9 for connecting the memory unit 71, 72 and the first pair of shared bit lines 73-74 under control of the WL 77 and WREN 78 signals, substantially as described above with reference to FIG. 3. However, the SRAM cell 70 also includes one or more additional pairs of read port transistors N16, N17 for connecting the read nodes D, C to a second pair of shared bit lines BL1, BLB1 75, 76 under control of the shared WL 77 signal.

Figure 8:
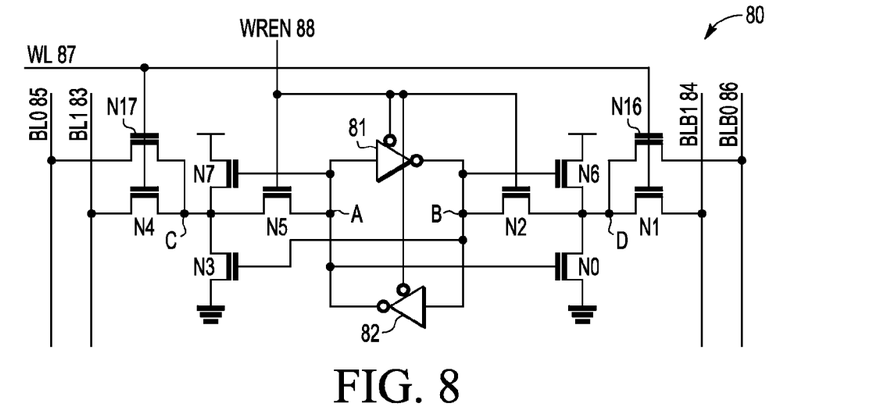
FIG. 8 is a simplified schematic diagram of a 16T SRAM cell with inverter cutoff transistors for dedicated read ports coupled to a plurality of bit line pairs.

An additional multi-bit line pair embodiment is illustrated with reference to FIG. 8 which shows a simplified schematic diagram of a 16T SRAM cell 80 with read node driver transistors N6, N7 and inverter cutoff transistors for a dedicated read port coupled to a plurality of bit line pairs. The depicted SRAM cell 80 includes a memory unit of two cross-coupled inverters 81, 82 (similar to the inverters 41, 42 shown in FIG. 4) with symmetric data access paths to a first pair of shared bit lines BL0, BLB0 83-84 which include access transistors N2, N5 and symmetric read ports N0/N2/N6, N3/N4/N7 for connecting the memory unit 81, 82 and the first pair of shared bit lines 83-84 under control of the WL 87 and WREN 88 signals, substantially as described above with reference to FIG. 4. However, the SRAM cell 80 also includes one or more additional pairs of read port transistors N16, N17 for connecting the read nodes D, C to a second pair of shared bit lines BL1, BLB1 85, 86 under control of the shared WL 87 signal.

With a cell design which uses a single word line and a common bit line pair for both read and write operations, the disclosed SRAM cell can be used in a variety of different memory array applications where it is desired to flexibly interleave one or more of the SRAM cells in an existing SRAM array. For example, the disclosed SRAM cells may be included in an SRAM array to detect soft errors which can be especially problematic with sub-threshold SRAMs due to the lower supply voltage Vdd and smaller gate capacitance. Previous sub-threshold SRAMs do not allow bit-interleaving when the cells that are in the unselected columns share the word line with the selected cells because write operations create significant stability degradation. Other sub-threshold SRAMS have proposed column-centric bit interleaving to cope with multiple-bit soft errors, albeit with SRAM cell designs that are not stable when write word line is selected but the write line is not selected.

With the SRAM cell designs disclosed herein, the SRAM cell may be interleaved by column, by row, or on any arbitrary basis throughout an array, thereby enabling bit-interleaving for applications such as providing multi-bit soft-error immunity. To provide an illustrative example application, reference is now made to FIG. 9 which depicts in block form an SRAM memory architecture 90 in which RF type bitcells 91-100 are interleaved with a 6T SRAM bitcell array. The depicted SRAM memory 90 includes representative memory cells 6T and RF type bitcells 91-100 arrayed in rows and columns along with a row decoder and column logic for implementing write circuitry 101 and read circuitry 102. The memory cells 6T in a row are coupled to a common word line (e.g., WL0 through WLn), and the memory cells 6T in a column are coupled to a shared bit line pair (e.g., bl0 and blb0 through blm and blbm), where the selection of the shared bit line pairs is controlled by selection logic in the write circuitry 101. Thus, the word line (WLi) and bit line pair (bli and blbi) are shared for both read and write operations to the individual memory cell 6T. The array of memory cells also includes a plurality of interleaved RF type bitcells (e.g., 91-100). Due the additional transistors, each RF type bitcell occupies more space in the array and therefore shown as being larger than a 6T memory cell. As depicted and described herein, the interleaved RF type bitcells share the word line (WLi) with memory cells 6T in the same row and share bit line pair (bli and blbi) with the memory cells 6T in the same column. In addition, any RF type bitcells in a column share a common write enable line (e.g., WREN0 through WRENm-2). As a result if this connection configuration, the interleaved RF type bitcells can be distributed in any desired pattern in the array so that they are not constrained to be located in a single column or row.

Figure 9:
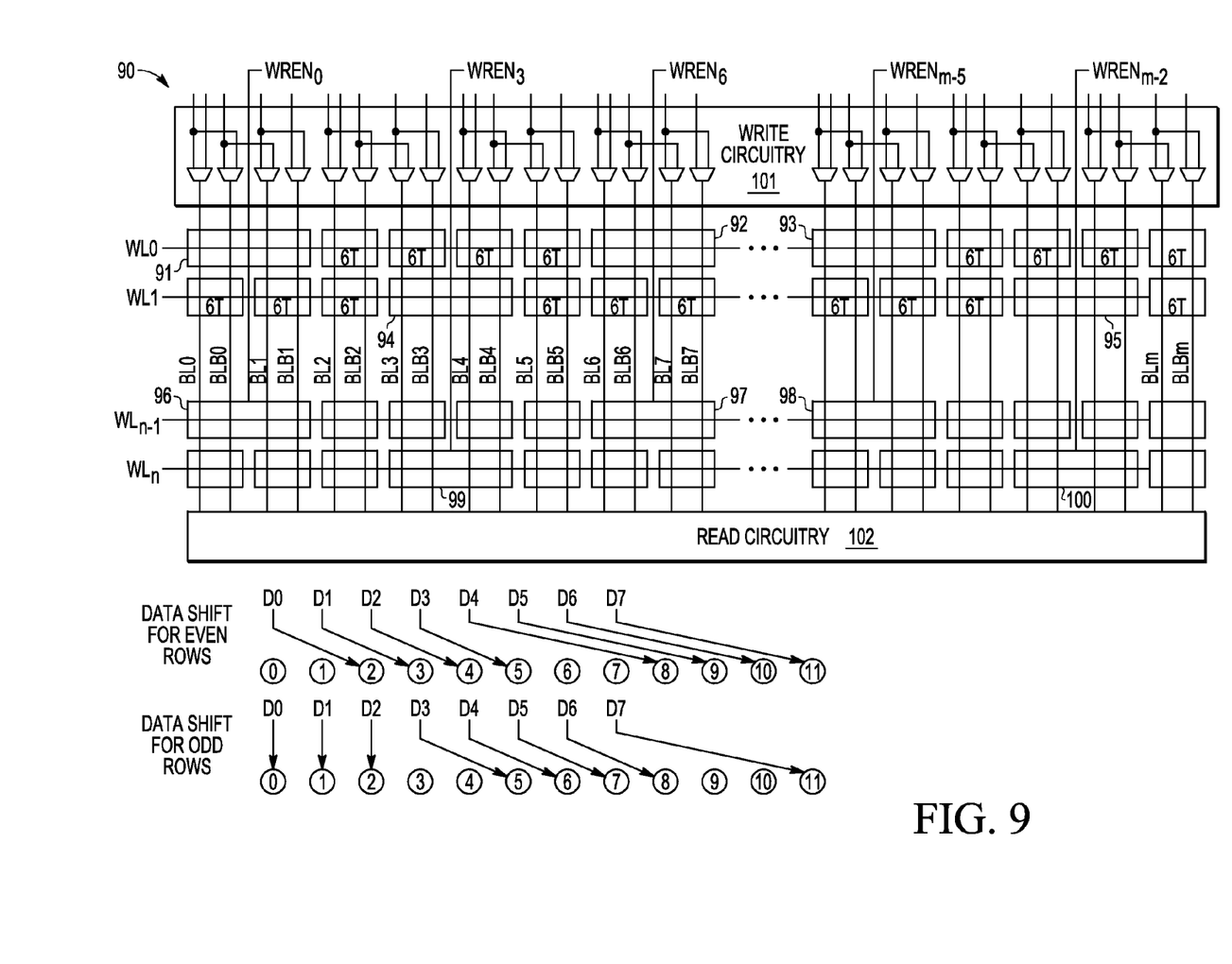
FIG. 9 illustrates in block form an SRAM architecture in which RF type bitcells sharing a common bit line pair and word line are interleaved with a 6T SRAM bitcell array.

As shown in the memory array structure in FIG. 9, WL0 is shared by the RF type bitcells 91-93 and memory cells 6T in the top row, WL1 is shared by the RF type bitcells 94-95 and memory cells 6T in the next row, and so on down to the bottom row n where WLn is shared by the RF type bitcells 99-100 and memory cells 6T in the last row. Similarly, the write enable signal for the first column WREN0 is shared by the RF type bitcells 91, 96 in the first column, the write enable signal for the fourth column WREN3 is shared by the RF type bitcells 94, 99 in the fourth column, and so on over to the last column (m-2) of RF type bitcells where the write enable signal for the m-2 column is shared by the RF type bitcells 95, 100 in the m-2 column. Since both WLi and WRENi must be enabled to write to a specified RF type bitcell i, each column is selected individually depending on the value of WRENi. In existing low voltage SRAMs design, the 6T bitcells have lower Static Noise Margin (SNM) which affects the stability of the 6T bitcells and makes the 6T bitcells sensitive to disturbance when accessed. During write operation when a given row is written, some of the bitcells in the row might not be updated due to way/column interleaving. As a result, these non-updated bitcells have increased risk to stability due to lowered SNM. In contrast, the RF bitcells disclosed herein can be used for bit-interleaving to detect the multiple-bit soft errors since write operations to an individual row of bitcells do not affect the hold stability of RF bitcells along the same wordline since the write enable WREN signal is shared by the RF bitcells in a column that are not enabled. When the WRENi of a column i is raised for writing a cell, the WREN signals of the other columns are held low so that the rise of WL does not affect hold stability of unwritten RF bitcells sharing the WL. Since the hold stability of other RF bitcells in the same row are not affected during write operations, bit interleaving may be implemented to detect multi-bit upset events due to soft-error rate event. The bit-interleaving pattern of the RF bitcell depends on multiple factors and these can be determined at the design of the SRAM arrays based on process technology both electrical and physical parameters and measurement data for multi-bit upset due to soft-error rate event.

As bitcell sizes shrink and less critical charge is stored at the storage node of the memory cell due to the lower VDD and the smaller gate capacitance, the soft-error rate (SER) is expected to be increase significantly since the upset charge remains the same, resulting in higher multi-bit upset soft error rates. The disclosed RF bitcell application provides a flagging mechanism for detecting multi-bit upset SER events by interleaving RF bitcells as "canary bits" in the memory array, where each interleaved canary bit is susceptible to charge disturbance from an SER event. Each canary bit is programmed with a known value so that a first value (e.g., "0") can be read out under normal operation and a second value (e.g., "1") is read out after an SER event. As will be appreciated, the spatial distance between the interleaved canary bits is determined by the bitcell type and technology (e.g., DRAM bitcells, flash bitcells, SRAM bitcells). For example, with SRAM technology, the canary bitcells may be interleaved every sixth column in each row, with the positioning varying between even rows and odd rows. In the example of FIG. 9, the canary bitcells on even rows (e.g., row 0, 2, . . . n-1) are located in the first column, seventh column, thirteenth column, etc., while the canary bitcells on odd rows (e.g., row 1, 3, . . . n) are located in the fourth column, tenth column, sixteenth column, etc. In this example configuration, data in the even rows of the array 90 is shifted by the write circuitry 101 during write operations to avoid the canary bitcells (e.g., 91 and 92 occupying the cell positions C0-C1 and C6-C7) so that data values D0-D3 are stored in the cells C2-05, data values D4-D7 are stored in the cells C8-C11, and so on. Conversely, the read circuitry 102 shifts the data read from the even rows to the left as required. For odd rows, data in the array 90 is shifted by the write circuitry 101 during write operations to avoid the canary bitcells (e.g., 94 occupying the fourth and fifth cell positions C3, C4) so that data values D0-D2 are stored in cells C0-C2, while data values D3-D6 are shifted over for storage in cells C5-C8, data value D7 is shifted over for storage in cell C11, and so on. Conversely, the read circuitry 102 shifts the data read from the odd rows to the left as required. In an example implementation, the write circuitry 101 and read circuitry each act as a multiplexer circuit that shifts data based on the least significant bit of the row address.

By now, it should be appreciated that there has been provided herein a memory architecture and associated method of operation. As disclosed, the memory includes a plurality of memory cells arranged in rows and columns with a plurality of word lines running in a row direction, a plurality of bit line pairs running in a column direction for reading and writing memory cell data, and a plurality of write enable lines running in a column direction. At least one of the memory cells is a static random access memory (SRAM) cell which includes a memory unit with two cross-coupled inverters for storing data at first and second internal nodes. While each inverter may be formed with an NMOS and PMOS transistor pair, the inverter may also include an NMOS and PMOS transistor pair that is coupled to a supply reference voltage by a PMOS transistor which is gated by the write enable line supplied to the SRAM cell, thereby turning off the inverter during a write operation. In addition, the SRAM cell includes two data access devices respectively controlling the cross-coupled inverters to enable data to be written from a pair of external nodes under control of a write enable line supplied to the SRAM cell. Each data access may be formed as an access transistor which is source-drain coupled between the memory unit and one of the pair of external nodes and which is gated by the write enable line supplied to the SRAM cell. Finally, the SRAM cell includes two read port devices respectively connected between the pair of external nodes and the bit line pair supplied to the SRAM cell and connected to the first and second internal nodes to enable data to be read from the memory unit under control of a word line supplied to the SRAM cell when the data access devices are turned off, where each read port device comprises a pull up device coupled to the external node. In selected embodiments, the each read port device includes a first transistor (which is source-drain coupled between one of the pair of external nodes and one bit line of the bit line pair supplied to the SRAM cell and which is gated by the word line supplied to the SRAM cell), a second transistor (which is source-drain coupled between one of the pair of external nodes and a first ground reference voltage and which is gated by one of the first and second internal nodes, and a third transistor (which is directly or indirectly source-drain coupled between one of the pair of external nodes and a second supply reference voltage and which is gated by the other of the first and second internal nodes, thereby forming the pull up device). In other embodiments, each read port device includes a first transistor (which is source-drain coupled between one of the pair of external nodes and one bit line of the bit line pair supplied to the SRAM cell and which is gated by the word line supplied to the SRAM cell), a second transistor (which is source-drain coupled between one of the pair of external nodes and a first ground reference voltage and which is gated by one of the first and second internal nodes), a third transistor (which is source-drain coupled between one of the pair of external nodes and a pull up node and which is gated by the other of the first and second internal nodes, thereby forming part of the pull up device), and a fourth transistor (which is source-drain coupled between the pull up node and a second supply reference voltage and which is gated by the write enable line supplied to the SRAM cell, thereby forming part of the pull up device). In other embodiments, the memory unit may include an additional pair of bit line access devices respectively connected between the pair of external nodes and the bit line pair supplied to the SRAM cell and gated by the word line supplied to the SRAM cell to enable data to be read from the memory unit under control of the word line when the data access devices are turned off. With this architecture, a plurality of register file SRAM cells can be interleaved with six-transistor SRAM cells in different rows and columns of an array, where each register file SRAM cell includes a memory unit of cross-coupled inverters, data access devices respectively controlling the cross-coupled inverters to enable data to be written from a pair of external nodes under control of a write enable line supplied to the SRAM cell, and read port devices respectively connected between the pair of external nodes and the bit line pair supplied to the SRAM cell and connected to the first and second internal nodes to enable data to be read from the memory unit under control of a word line supplied to the SRAM cell when the data access devices are turned off, where each read port device comprises a pull up device coupled to the external node.

In another form, there is provided a twelve-transistor static random access memory (SRAM) cell architecture where each cell includes a memory unit, two data access transistors, two read port devices and a pull-up transistor device. The memory unit includes two inverters for storing data via switching activities of the inverters, where each inverter comprises a load transistor and a pass transistor connected to a storage node. For example, the memory unit may be formed with two cross-coupled inverters respectively formed with an NMOS and PMOS transistor pair for storing data to a pair of storage nodes. In selected embodiments, each inverters is formed with an NMOS and PMOS transistor pair that is coupled to a supply reference voltage by a PMOS transistor which is gated by the write enable line supplied to the SRAM cell, thereby turning off the inverters during a write operation. The data access transistors are respectively connected between a cell read node and one of the storage nodes in the memory unit for controlling said two inverters to enable data to be accessed via word lines. For example, each data access transistor is an NMOS transistor which is source-drain coupled between the memory unit and one of the pair of cell read nodes and which is gated by the write enable line. The read port devices are respectively arranged beside said two data access transistors symmetrically, connected to bit lines and said word lines, and providing additional data access paths to drive a corresponding cell read node without exposing the storage node of the memory cell during read operations and to act as a write port during write operations. For example, each read port device is formed with a first transistor (which is source-drain coupled between one of the pair of cell read nodes and one bit line of a bit line pair supplied to the SRAM cell and which is gated by the word line supplied to the SRAM cell) and a second transistor (which is source-drain coupled between one of the pair of cell read nodes and a ground reference voltage and which is gated by one of the storage nodes). Finally, the pull-up transistor device includes a third transistor (which is directly or indirectly source-drain coupled between one of the pair of cell read nodes and a supply reference voltage and which is gated by the other of the storage nodes) and may also include a fourth transistor (which is source-drain coupled between the third transistor and the supply reference voltage and which is gated by the write enable line supplied to the SRAM cell). In addition, an additional pair of bit line access transistors may be respectively connected between the pair of cell read node and the bit line pair supplied to the SRAM cell and gated by the word line supplied to the SRAM cell to enable data to be read from the memory unit under control of the word line when the two data access transistors are turned off.

In yet another form, there is provided a static random access memory (SRAM) array which includes a plurality of memory cells arranged in rows and columns, a plurality of word lines running in a row direction, a plurality of bit line pairs running in a column direction for reading and writing memory cell data, and a plurality of write enable lines running in a column direction. In particular, the plurality of memory cells includes six-transistor (6T) SRAM cells arranged in rows and columns such that 6T SRAM cells in a column share a bit line pair and a write enable line and 6T SRAM cells in a row share a word line. The plurality of memory cells also includes register file bitcells interleaved in the rows and columns such that register file bitcells in a column share a bit line pair and a write enable line and register file bitcells in a row share a word line, where each register file bitcell comprises a write port and a read port sharing a common bit line pair and a common word line such that the read port does not disturb the register file bitcell when connected to the bit line pair by the common word line. Each of the register file bitcells may be formed as a static random access memory (SRAM) cell which includes a memory unit comprising two inverters for storing data via switching activities of the inverters, where each inverter comprises a load transistor and a pass transistor connected to a storage node. The SRAM cell also includes two data access transistors respectively connected between a cell read node and one of the storage nodes in the memory unit for controlling said two inverters to enable data to be accessed via word lines. In addition, the SRAM cell includes two read ports respectively arranged beside said two data access transistors symmetrically, connected to bit lines and said word lines, and providing additional data access paths to drive a corresponding cell read node without exposing the storage node of the memory cell during read operations and to act as a write port during write operations. In selected embodiments, each read port includes a first transistor (which is source-drain coupled between one of the pair of cell read nodes and one bit line of a bit line pair supplied to the SRAM cell and which is gated by the word line supplied to the SRAM cell) and a second transistor (which is source-drain coupled between one of the pair of cell read nodes and a ground reference voltage and which is gated by one of the storage nodes). Finally, the SRAM cell includes a pull up device connected to each cell read node, where the pull up device may include a third transistor which is directly or indirectly source-drain coupled between one of the pair of cell read nodes and a supply reference voltage and which is gated by the other of the storage nodes.

In still further embodiments, there is disclosed a memory architecture and associated method of operation. As disclosed, the memory includes a plurality of memory cells arranged in rows and columns with a plurality of word lines running in a row direction, a plurality of bit line pairs running in a column direction for reading and writing memory cell data, and a plurality of write enable lines running in a column direction. At least one of the memory cells is a static random access memory (SRAM) cell which includes a memory unit with two cross-coupled inverters for storing data at first and second internal nodes. The SRAM cell also includes two data access devices respectively coupled to the first and second internal nodes and controlling the cross-coupled inverters to enable data to be written from a pair of external nodes under control of a write enable line supplied to the SRAM cell. In addition, the SRAM cell includes two port devices respectively connected between the first and second internal nodes and a first bit line pair supplied to the SRAM cell to enable data to be read from the memory unit under control of a word line supplied to the SRAM cell when the data access devices are turned off. Each port device includes first and second bitline access device pairs. The first pair of bitline access devices are respectively connected between the pair of external nodes and a first bitline pair bit line supplied to the SRAM cell and gated by the word line supplied to the SRAM cell to enable data to be read from the memory unit under control of the word line when the data access devices are turned off. In addition, the second pair of bitline access devices are respectively connected between the pair of external nodes and a second bitline pair bit line supplied to the SRAM cell and gated by the word line supplied to the SRAM cell to enable data to be read from the memory unit under control of the word line when the data access devices are turned off.

Although the described exemplary embodiments disclosed herein are directed to an RF type bitcell which shares a bit line pair and wordline with other cells in an SRAM array and methods for making and operating same, the present invention is not necessarily limited to the example embodiments which illustrate inventive aspects of the present invention that are applicable to a wide variety of memory types. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the various devices illustrated herein are described with reference to SRAM memory cell embodiments, these are merely for convenience of explanation and not intended to be limiting and persons of skill in the art will understand that the principles taught herein apply to other memory types. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A memory comprising:
 a plurality of memory cells arranged in rows and columns;
 a plurality of word lines running in a row direction;
 a plurality of bit line pairs running in a column direction for reading and writing memory cell data; and
 a plurality of write enable lines running in a column direction;
 where the plurality of memory cells comprises a plurality of static random access memory (SRAM) cells, each comprising:
 a memory unit comprising two cross-coupled inverters for storing data at first and second internal nodes;
 two data access devices respectively coupled to the first and second internal nodes and controlling the cross-coupled inverters to enable data to be written from a pair of external nodes under control of a write enable line supplied to the SRAM cell; and
 two read port devices respectively connected between the first and second internal nodes and a bit line pair supplied to the SRAM cell to enable data to be read from the memory unit under control of a word line supplied to the SRAM cell when the data access devices are turned off, where each read port device comprises a pull up device coupled to an external node, where each read port device comprises:
 a first transistor which is source-drain coupled between one of the pair of external nodes and one bit line of the bit line pair supplied to the SRAM cell and which is gated by the word line supplied to the SRAM cell;
 a second transistor which is source-drain coupled between one of the pair of external nodes and a first ground reference voltage and which is gated by one of the first and second internal nodes;
 a third transistor which is source-drain coupled between one of the pair of external nodes and a pull up node and which is gated by the other of the first and second internal nodes; and
 a fourth transistor which is source-drain coupled between the pull up node and a second supply reference voltage and which is gated by the write enable line supplied to the SRAM cell.

2. The memory of claim 1, where each of the cross-coupled inverters is formed with an NMOS and PMOS transistor pair.

3. The memory of claim 1, where each of the data access devices comprises an access transistor which is source-drain coupled between the memory unit and one of the pair of external nodes and which is gated by the write enable line supplied to the SRAM cell.

4. The memory of claim 1, where each of the cross-coupled inverters is formed with an NMOS and PMOS transistor pair that is coupled to the second supply reference voltage by a PMOS transistor which is gated by the write enable line supplied to the SRAM cell, thereby turning off the inverter during a write operation.

5. The memory of claim 1, where the memory unit further comprises a pair of bit line access devices respectively connected between the pair of external nodes and a second bit line pair supplied to the SRAM cell and gated by the word line supplied to the SRAM cell to enable data to be read from the memory unit under control of the word line when the data access devices are turned off.

6. The memory of claim 1, where the each static random access memory cell is interleaved with a plurality of six-transistor SRAM cells.

7. A static random access memory (SRAM) cell, comprising:
 a memory unit comprising two cross-coupled inverters for storing data at a pair of storage nodes via switching activities of the inverters, where each of the inverters is formed with an NMOS and PMOS transistor pair that is coupled to a supply reference voltage by a PMOS transistor which is gated by a write enable line supplied to the SRAM cell, thereby turning off the inverters during a write operation;
 two data access transistors respectively connected between a pair of cell read nodes and the pair of storage nodes for writing data to the memory unit under control of a write enable line;
 two read port devices, each connected between a bit line and a storage node in the memory unit to provide a data access path under control of a word line to drive a cell read node without exposing the storage node of the memory cell during read operations; and
 a pull up transistor device connected to each read port device.

8. The SRAM cell of claim 7, where each of the two data access transistors comprises an NMOS transistor which is source-drain coupled between the memory unit and one of the pair of cell read nodes and which is gated by the write enable line.

9. The SRAM cell of claim 7, where each of the two read port devices comprises:
 a first transistor which is source-drain coupled between one of the pair of cell read nodes and one bit line of a bit line pair supplied to the SRAM cell and which is gated by the word line supplied to the SRAM cell; and
 a second transistor which is source-drain coupled between one of the pair of cell read nodes and a ground reference voltage and which is gated by a first storage node from the pair of storage nodes.

10. The SRAM cell of claim 9, where the pull up transistor device comprises a third transistor which is source-drain coupled between one of the pair of cell read nodes and a supply reference voltage and which is gated by a second storage node from the pair of storage nodes.

11. The SRAM cell of claim 10, where the pull up transistor device further comprises a fourth transistor which is source-drain coupled between the third transistor and the supply reference voltage and which is gated by the write enable line supplied to the SRAM cell.

12. The SRAM cell of claim 7, further comprising an additional pair of bit line access transistors respectively connected between the pair of cell read node and the bit line pair supplied to the SRAM cell and gated by the word line supplied to the SRAM cell to enable data to be read from the memory unit under control of the word line when the two data access transistors are turned off.

13. A static random access memory (SRAM) array comprising:
 a plurality of memory cells arranged in rows and columns;
 a plurality of word lines running in a row direction;
 a plurality of bit line pairs running in a column direction; and
 a plurality of write enable lines running in a column direction;
 where the plurality of memory cells comprises:
 a plurality of six-transistor (6T) SRAM cells arranged in rows and columns such that 6T SRAM cells in a column share a bit line pair and a write enable line and 6T SRAM cells in a row share a word line; and a plurality of SRAM bitcells interleaved in the rows and columns such that bitcells in a column share a bit line pair and a write enable line and bitcells in a row share a word line, where each bitcell comprises a write port and a read port sharing a common bit line pair and a common word line such that the read port does not disturb the bitcell when connected to the bit line pair by the common word line.

14. The SRAM array of claim 13, where each of the plurality of SRAM bitcells comprises a static random access memory (SRAM) cell comprising:
    a memory unit comprising two cross-coupled inverters for storing data at a pair of storage nodes via switching activities of the inverters;
    two data access transistors respectively connected between a pair of cell read nodes and the pair of storage nodes in the memory unit for controlling said two inverters to enable data to be written from the common bit line pair to the pair of storage nodes under control of a write enable line;
    two read ports connected to the common bit line pair and a word line, and providing additional data access paths to drive the pair of cell read nodes without exposing the pair of storage nodes of the memory cell during read operations and to act as a write port during write operations; and
    a pull up device connected to each cell read node.

15. The SRAM array of claim 14, where each of the two read ports comprises:
    a first transistor which is source-drain coupled between one of the pair of cell read nodes and one bit line of a bit line pair supplied to the SRAM cell and which is gated by the word line supplied to the SRAM cell; and
    a second transistor which is source-drain coupled between one of the pair of cell read nodes and a ground reference voltage and which is gated by one of the pair of storage nodes.

16. The SRAM array of claim 15, where the pull up device comprises a third transistor which is directly or indirectly source-drain coupled between one of the pair of cell read nodes and a supply reference voltage and which is gated by the other of the pair of storage nodes.

17. A memory comprising:
    a plurality of memory cells arranged in rows and columns;
    a plurality of word lines running in a row direction;
    a plurality of bit line pairs running in a column direction for reading and writing memory cell data; and
    a plurality of write enable lines running in a column direction;
    where the plurality of memory cells comprises a static random access memory (SRAM) cell comprising:
    a memory unit comprising two cross-coupled inverters for storing data at first and second internal nodes;
    two data access devices respectively coupled to the first and second internal nodes and controlling the cross-coupled inverters to enable data to be written from a pair of external nodes under control of a write enable line supplied to the SRAM cell; and
    two port devices respectively connected between the first and second internal nodes and a first bit line pair supplied to the SRAM cell to enable data to be read from the memory unit under control of a word line supplied to the SRAM cell when the data access devices are turned off, where each port device comprises:
        a first pair of bitline access devices respectively connected between the pair of external nodes and a first bitline pair supplied to the SRAM cell and gated by the word line supplied to the SRAM cell to enable data to be read from the memory unit under control of the word line when the data access devices are turned off; and
        a second pair of bitline access devices respectively connected between the pair of external nodes and a second bitline pair supplied to the SRAM cell and gated by the word line supplied to the SRAM cell to enable data to be read from the memory unit under control of the word line when the data access devices are turned off.

18. A memory comprising:
    a plurality of memory cells arranged in rows and columns;
    a plurality of word lines running in a row direction;
    a plurality of bit line pairs running in a column direction for reading and writing memory cell data; and
    a plurality of write enable lines running in a column direction;
    where the plurality of memory cells comprises a plurality of static random access memory (SRAM) cells, each comprising:
    a memory unit comprising two cross-coupled inverters for storing data at first and second internal nodes;
    two data access devices respectively coupled to the first and second internal nodes and controlling the cross-coupled inverters to enable data to be written from a pair of external nodes under control of a write enable line supplied to the SRAM cell; and
    two read port devices respectively connected between the first and second internal nodes and a bit line pair supplied to the SRAM cell to enable data to be read from the memory unit under control of a word line supplied to the SRAM cell when the data access devices are turned off, where each read port device comprises a pull up device coupled to an external node, where each read port device comprises:
    a first transistor which is source-drain coupled between one of the pair of external nodes and one bit line of the bit line pair supplied to the SRAM cell and which is gated by the word line supplied to the SRAM cell;
    a second transistor which is source-drain coupled between one of the pair of external nodes and a first ground reference voltage and which is gated by one of the first and second internal nodes; and
    a third transistor which is source-drain coupled between one of the pair of external nodes and a second supply reference voltage and which is gated by the other of the first and second internal nodes, thereby forming the pull up device,
    where each of the cross-coupled inverters is formed with an NMOS and PMOS transistor pair that is coupled to the second supply reference voltage by a PMOS transistor which is gated by the write enable line supplied to the SRAM cell, thereby turning off the inverter during a write operation.

19. A static random access memory (SRAM) cell, comprising:
    a memory unit comprising two cross-coupled inverters for storing data at a pair of storage nodes via switching activities of the inverters;
    two data access transistors respectively connected between a pair of cell read nodes and the pair of storage nodes for writing data to the memory unit under control of a write enable line;
    two read port devices, each connected between a bit line and a storage node in the memory unit to provide a data access path under control of a word line to drive a cell read node without exposing the storage node of the memory cell during read operations, where each of the two read port devices comprises:

a first transistor which is source-drain coupled between one of the pair of cell read nodes and one bit line of a bit line pair supplied to the SRAM cell and which is gated by the word line supplied to the SRAM cell, and a second transistor which is source-drain coupled between one of the pair of cell read nodes and a ground reference voltage and which is gated by a first storage node from the pair of storage nodes; and a pull up transistor device connected to each read port device, where the pull up transistor device comprises:

a third transistor which is source-drain coupled between one of the pair of cell read nodes and a supply reference voltage and which is gated by a second storage node from the pair of storage nodes, and a fourth transistor which is source-drain coupled between the third transistor and the supply reference voltage and which is gated by the write enable line supplied to the SRAM cell.

* * * * *